United States Patent [19]

Kawakami et al.

[11] Patent Number: 5,015,973
[45] Date of Patent: May 14, 1991

[54] DUPLEXER WITH AN ISOLATING CIRCUIT ON A DIELECTRIC PLATE

[75] Inventors: Izumi Kawakami; Tomokazu Komazaki; Katsuhiko Gunji; Norio Onishi; Yoshimitsu Sakurai; Hiroyuki Horii; Akira Mashimo, all of Tokyo, Japan

[73] Assignee: Oki Electric Industry Co., Ltd., Tokyo, Japan

[21] Appl. No.: 237,673

[22] Filed: Aug. 26, 1988

[30] Foreign Application Priority Data

Aug. 31, 1987 [JP] Japan .................. 62-215047
Aug. 31, 1987 [JP] Japan .................. 62-215048
Aug. 31, 1987 [JP] Japan .................. 62-215049

[51] Int. Cl.$^5$ ............................................ H03H 7/46
[52] U.S. Cl. .................... 333/132; 333/134; 333/202; 333/206; 455/82; 455/83
[58] Field of Search ............ 333/126, 129, 132, 134, 333/136, 202, 206, 207, 222, 223; 455/78, 80, 82, 83

[56] References Cited

U.S. PATENT DOCUMENTS

| 2,768,351 | 10/1956 | Scholten et al. | 333/129 |
| 3,656,162 | 4/1972 | Mee | 370/38 |
| 4,462,098 | 7/1984 | D'Avello et al. | 333/134 X |
| 4,730,173 | 3/1988 | Tsunoda | 333/206 |
| 4,799,033 | 1/1989 | Igarashi et al. | 333/134 |

FOREIGN PATENT DOCUMENTS

| 3425117 | 1/1986 | Fed. Rep. of Germany . | |
| 1150931 | 1/1958 | France . | |
| 57-204603 | 12/1982 | Japan . | |
| 112702 | 6/1984 | Japan | 333/134 |
| 214338 | 12/1984 | Japan | 455/78 |
| 61-208902 | 9/1986 | Japan . | |
| 214625 | 9/1986 | Japan | 455/83 |
| 62-101 | 1/1987 | Japan . | |
| 18801 | 1/1987 | Japan | 333/206 |
| 52-136104 | 6/1987 | Japan . | |
| 52-136105 | 6/1987 | Japan . | |
| 217701 | 9/1987 | Japan | 333/202 |
| 239701 | 10/1987 | Japan | 333/206 |
| 144602 | 6/1988 | Japan | 333/202 |
| 63-204901 | 8/1988 | Japan . | |

OTHER PUBLICATIONS

Uwano, Tomoki, "Ceramic-Filled Resonator Cuts Costs of Radio-Telephone Filters", *Electronics*, Jul. 14, 1983, pp. 129–131.

*Primary Examiner*—Benny Lee
*Attorney, Agent, or Firm*—Spencer & Frank

[57] ABSTRACT

A circuit such as a duplexer which isolates a first and second frequency signals respectively directed to and from an antenna terminal. A transmitter filter has an output terminal connected to a connecting point through a first inductor. A receiver filter has an input terminal connected to the connecting point. The connecting point is connected to the antenna terminal, and to ground through a second inductor. In a modified circuit the output terminal of the transmitter filter and the input terminal of the receiver filter are respectively connected to the connecting point through first and second capacitors. In the preferred embodiments the transmitter filter and the receiver filter are mounted to one side of a dielectric plate and the inductor and/or capacitors are formed by electrically conductive step lines and a capacitance patterns formed on the opposite side of the dielectric plate.

15 Claims, 12 Drawing Sheets

DUPLEXER WITH AN ISOLATING CIRCUIT ON A DIELECTRIC PLATE

BACKGROUND OF THE INVENTION

The invention relates to a duplexer which is well adapted for a mobile telephone.

In duplex operation of a radio transmitter and a receiver connected to a common antenna, a duplexer is required so as to effectively isolate the transmitter and the receiver to permit simultaneous operation, especially, where the transmitting and receiving frequencies are closely spaced. A conventional duplexer is described in detail in U.S. Pat. No. 3,656,162 and Japanese Laid-open Patent Publication Nos. 87-136104 and 87-136105.

A duplexer described in U.S. Pat. No. 3,656,162 employs two coaxial cables which are respectively connected between an antenna terminal and a receiver terminal through a filter, and between a transmitter terminal through a filter and the antenna terminal. The length of one of the coaxial cables connected to the transmitter terminal, must be equal to around a quarter wavelength of the receiver frequency in order to reject the transmitter noise or harmonics at or near the receiver frequencies. The length of the other coaxial cable connected to the receiver terminal similarly must be equal to around a quarter wavelength of the transmitter frequency in order to reject the receiver noise or hermonics at or near the transmitter frequencies.

Another conventional duplexer, which has been proposed in order to reduce the size of the duplexer, is disclosed in Japanese Laid-open Patent Publication Nos. 87-136104 and 87-136105, both of which were issued on June 19, 1987 and assigned to the assignee of the present invention. The duplexer employs two distributed constant lines such as a strip line, in place of the two coaxial cables, both of which are formed on a dielectric material plate made of alumina or glass-epoxy resin materials by a thick-layer printing method or a plating method. The duplexer further employs a transmitter dielectric filter which is connected in series relation with one of the distributed constant lines to an antenna terminal and a receiver dielectric filter which is connected in series relation with the other distributed constant line to the antenna terminal. The lengths of the distributed constant line can respectively be calculated, for example, in the following manner:

An element $S_{11}(1)$ of the dispersion matrix S showing a characteristic of the network comprised of the transmitter distributed constant line and the transmitter filter connected in series, is generally expressed by the following equation (1):

$$S_{11}(1) = [r\cos\theta - \cos\theta + z\sin\theta + j(\sin\theta + z\cos\theta - r\sin\theta)] / \quad (1)$$

$$[r\cos\theta + \cos\theta - z\sin\theta + j(\sin\theta + z\cos\theta - r\sin\theta)]$$

wherein
r is the real part of the input impedance of the transmitter filter when the input impedence is expressed as r+j z;
z is the constant term of the imaginary part thereof:
j is the imaginary unit thereof;
λ is the wavelength of the receiver frequency;
l is the length of the transmitter distributed constant line; $\theta = \beta l$; and $\beta = 2\pi/\lambda$.

If the above equation (1) satisfies the following equation (2)

$$\cos\theta = z\sin\theta \quad (2)$$

an input impedance of the network can be increased at and near the receiver frequencies so as to effectively reject the transmitter noise and harmonics at and near the receiver frequencies. If, in accordance with the equation (2), $z\sin\theta$ is substituted for $\cos\theta$ in the equation (1), equation (1) becomes $$S_{11}(1) = [r\cos\theta + j(\sin\theta + z^2\sin\theta - r\sin\theta)] / \quad (3)$$

$$[r\cos\theta + j(\sin\theta + z^2\sin\theta + r\sin\theta)].$$

The element $S_{11}(1)$ can also be expressed in terms of the input impedance Zin of the network as in the following equation (4) when the driving impedance of the network is assumed to be 1 ohm:

$$S_{11}(1) = (Zin-1)/(Zin+1), \quad (4)$$

From the foregoing equations (3) and (4), the input impedance (Zin) can be expressed by the following equation (5):

$$Zin = [(1+z^2)/r] - jz. \quad (5)$$

According to equation (5), the real part r of the transmitter filter's input impedance can be assumed to be much less than 1 because Zin>>1, that is, the input impedance (Zin) of the network is required to be increased at and near the receiver frequencies, and the phase angle of the network can also be assumed as zero degree because the real part $[(1+z^2)/r]$ of the input impedance (Zin) is increased at and near the receiver frequencies. Tests have been performed with transmitter and receiver distributed constant lines (in the form of strip lines) used in mobile telephones whose transmitter frequency band is from 825 to 845 MHz and whose receiver frequency band is from 870 to 890 MHz. Each line had a width of 1.8 mm and a characteristic impedance of 50 ohm, and was formed on a glass-epoxy plate whose thickness was 1.0 mm and specific inductive capacity (dielectric constant) was 4.8. The lines were respectively connected to the transmitter and the receiver dielectric filters and were respectively set to have a phase angle around zero degree. To obtain the required large input impedance, the tests showed that the length of the transmitter line must be 84 mm and that of the receiver line must be 60 mm. However, the distributed constant lines of the above mentioned duplexer are still subject to having lengths equal to the corresponding quarter wavelengths of the rejected frequencies (these quarter wavelengths being reduced in the strip lines on the dielectric plate as compared to coaxial cables) so that formulation of a duplexer in this manner thereby presents an obstacle to further reduction of the size of the duplexer.

SUMMARY OF THE INVENTION

Accordingly, it is an object of the present invention to reduce the size of a duplexer.

It is another object of the present invention to provide an improved circuit which can be easily designed with freedom from the restriction that the distributed constant lines have lengths equal to those of the corresponding quarter wavelength of the rejected frequency.

A circuit of the invention, in order to isolate a first frequency signal and second frequency signal, includes an antenna terminal, a connecting point, a first filter and a second filter. The first filter which is coupled to the first frequency signal has a first input terminal and a first output terminal, one of which in connected in series relation with a first inductor to the connecting point. The second filter which is coupled to the second frequency signal has a second input terminal and a second output terminal, one of which is connected to the connecting point. The connecting point is connected to the antenna terminal and further connected in series relation with a second inductor to ground. The circuit may include a third inductor which is connected in series between the connecting point and the antenna terminal and a capacitor which is connected in series relation between the connecting point and one of the first input terminal and the first output terminal. The circuit can effectively isolate the first filter and the second filter by appropriate selection of the values of the first inductor, the second inductor, the third inductor and the capacitor so that the return loss of the circuit is larger than 10 dB at each frequency of the first frequency signal and the second frequency signal.

A modified circuit of the invention in order to isolate a first frequency signal and second frequency signal also includes an antenna terminal, a connecting point, a first filter and a second filter. The first filter which is coupled to the first frequency signal has a first coupling terminal which is connected in series relation with a first capacitor to the connecting point. The second filter which is coupled to the second frequency signal has a second coupling terminal which is connected in series relation with a second capacitor to the connecting point. The connecting point is connected to the antenna terminal. The modified circuit can effectively isolate the first filter and the second filter by appropriate selection of the values of the first capacitor and the second capacitor so that the return loss of the circuit is larger than 10 dB at each frequency of the first frequency signal and the second frequency signal.

In accordance with another aspect of a duplexer of the invention, in order to transmit a transmitter frequency signal to, and simultaneously receive a receiver frequency signal from a common antenna terminal through a connecting point, also includes a transmitter filter, a receiver filter and dielectric plate. The transmitter filter which is coupled to the transmitter frequency signal has a transmitter output terminal which is coupled in series relation with a first conductive line to the connecting point. The receiver filter which is coupled to the receiver frequency signal has a receiver input terminal which is coupled in series relation with a second conductive line to the connecting point. The connecting point is coupled in series relation with a third conductive line to the antenna terminal. The dielectric plate has a specific inductive capacity and is covered with a conductive layer which is to be grounded. The dielectric plate is further covered with a fourth conductive line on the surface thereof and thereby the fourth conductive line and the dielectric plate form a first inductor. The first conductive line, the second conductive line and the third conductive line may be formed on the surface of the dielectric plate and thereby these lines with the dielectric plate form the other inductors. The second conductive line may has a capacitance pattern on the dielectric plate to form a capacitor. The duplexer can effectively isolate the transmitter filter and the receiver filter by appropriate selection of the values of the first inductor, the other inductors and the capacitor so that the return loss of the circuit is larger than 10 dB at each frequency of the first frequency signal and the second frequency signal.

BRIEF DESCRIPTION OF THE DRAWINGS

These and other features and advantages of the invention will be more completely understood from the folowing detailed description of the preferred embodiments with reference to the accompanying drawings in which:

FIG. 1 (b) is a bottom perspective view of the duplexer shown in FIG. 1 (a);

FIG. 9 (b) is a bottom perspective view of the duplexer shown in FIG. 9 (a);

FIG. 12 (b) is an equivalent circuit of a receiver filter employed in the duplexer shown in FIGS. 9 (a) and 9 (b);

DETAILED DESCRIPTION OF THE PREFERRED EMBODIMENTS

Figure 1A:
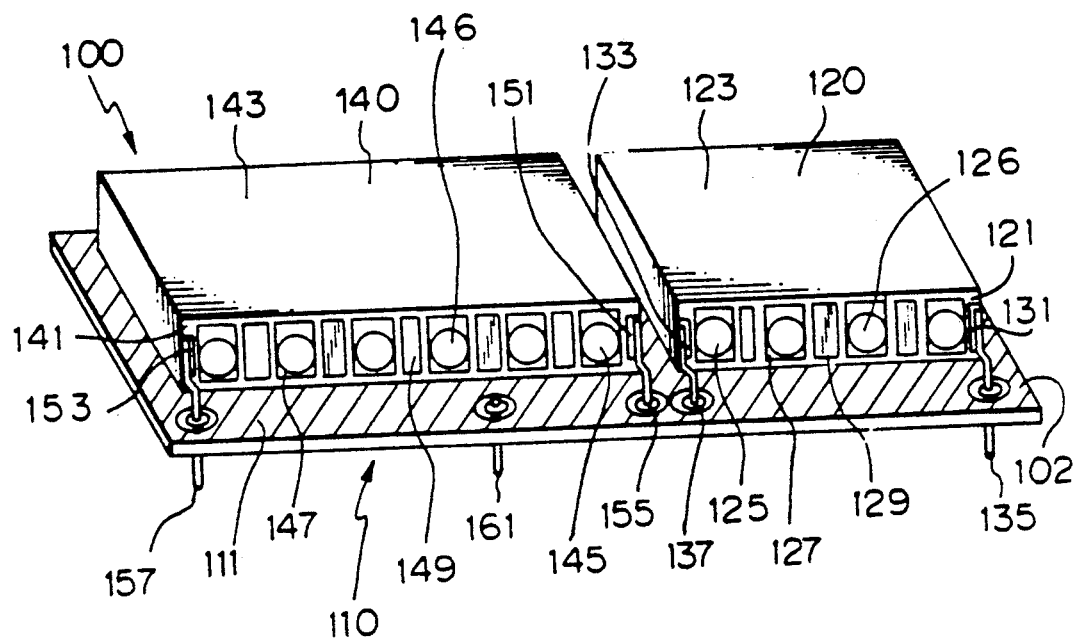
FIG. 1 (a) is a top perspective view of a first embodiment of a duplexer in accordance with the invention.
Figure 1B:
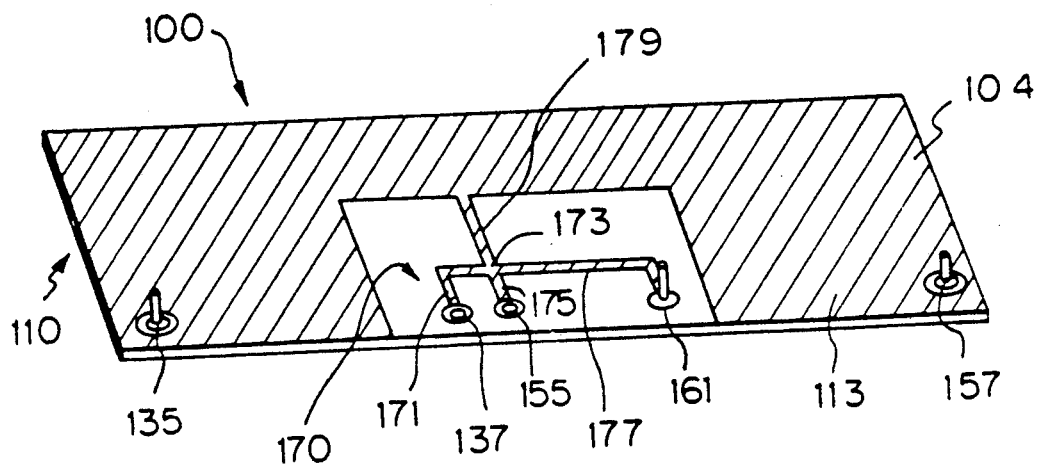

Referring to FIGS. 1 (a) and 1 (b), there is illustrated a duplexer 100 embodying the present invention, FIG. 1 (a) shows the duplexer elements mounted on one surface 102 of a dielectric material plate 110 and FIG. 1 (b) shows the duplexer elements formed on the other surface 104 of the dielectric material plate 110.

The dielectric plate 110 is formed of alumina or glass-epoxy resin material and mounts a transmitter dielectric filter 120 and a receiver dielectric filter 140 on the surface 102. The transmitter filter 120 and the receiver filter 140 respectively include a substantially rectangularly shaped block of ceramic material, primarily BaO and TiO, having throughholes 126 and 146, whose outer surface is covered with a layer of a conductive material such as a silver or copper, except for the front side outer surfaces 121 and 141, so as to form outer conductive layers 123 and 143. The cylindrical interior surfaces of the throughholes 126 and 146 are respectively entirely covered with a layer of the conductive material so as to form inner conductive layers 125 and 145.

The transmitter filter 120 as shown in FIG. 1 (a), has four such inner conductive layers 125 which are respectively connected to the outer conductive layer 123 at the rear side outer surface of the filter 120 (not shown), opposite to the front side outer surface 121, and are respectively connected to conductive layers 127 at least partially surrounding the openings of the throughholes 126 at the front side outer surface 121, whereby each of the inner conductive layers 125, surrounded by the dielectric material enclosed in the outer conductive layers 123, acts as a dielectric resonator. The conductive layers 127 are used for adjusting the resonant frequency of the resonators after initial construction, by removing an appropriate amount of conductive material therefrom. The magnitude of the coupling between adjacent resonators is adjusted by removing an appropriate portion of conductive layers 129 on the front side outer surface 121 provided between the frequency adjusting layers 127. The transmitter filter 120 further has an input electrode 131 and an output electrode 133 respectively provided adjacent to the side edges of the front side outer surface 121.

The receiver filter 140 has six throughholes 146 covered with inner conductive layers 145 which are connected to the outer conductive layer 143 at the rear side outer surface of the filter 140 (not shown), opposite to the front side outer surface 141, and are respectively connected to conductive layers 147 at the front side surface 141, whereby each of the inner conductive layers 145, surrounded by the dielectric material enclosed in the outer conductive layers 143, acts as a dielectric resonator. The magnitude of the coupling between adjacent resonators is adjusted by removing an appropriate portion of conductive layers 149 provided on the one side outer surface 141 between the frequency adjusting layers 147. The receiver filter 140 further has an input electrode 151 and an output electrode 153 respectively provided adjacent the side edges of the front side outer surface 141.

The above mentioned filter structure will be more clearly understood from the co-pending U.S. patent application Ser. No. 074,640 filed on July 17, 1987 now U.S. Pat. No. 4,768,003 issued Aug. 30th, 1988 and Ser. No. 169,290 filed on Mar. 17, 1988 now abandoned, both of which are continuation in part application of patent application Ser. No. 780,649 now abandoned, co-pending U.S. patent application Ser. No. 048,633 filed on Apr. 23, 1987 now U.S. Pat. No. 4,808,951 issued Feb. 28th, 1989 and the application of Matsukura et al. filed on Aug. 3, 1988 now U.S. Pat. No. 4,855,693 issued Aug. 8th, 1989, all of which are assigned to the assignee of the present application.

The surface 102 of the dielectric plate 110 is entirely covered with a layer 111 of the conductive material except for portions surrounding throughholes which are adapted to receive a transmitter input terminal 135 connected to the input electrode 131, a transmitter output terminal 137 connected to the output electrode 133, a receiver input terminal 155 connected to the electrode 151, a receiver output terminal 157 connected to the output electrode 153 and an antenna terminal 161. The conductive layer 111 covering the dielectric plate 110 is to be grounded and is connected to each of the outer conductive layers 123 and 143 by means of a conductive adhesives or solder along bottom surfaces of the filter 120 and 140 so as to also ground the outer conductive layers 123 and 143.

Referring to FIG. 1 (b) which shows the bottom surface 104 of the dielectric plate 110 shown in FIG. 1 (a), the bottom surface of the dielectric plate 110 is also covered with a layer 113 of the conductive material except for portions surrounding a duplex circuit 170 and throughholes which are adapted to receive a transmitter input terminal 135 connected to the input electrode 131, a transmitter output terminal 137 connected to the output electrode 133, a receiver input terminal 155 connected to the electrode 151, a receiver output terminal 157 connected to the output electrode 153 and the antenna terminal 161, the terminals being insulated from the conductive layers 111 and 113. The conductive layer 113 covering the other surface of the dielectric plate 110 is also grounded.

The duplexer circuit 170 formed on the dielectric plate includes a first conductive strip line 171 extending from the transmitter output terminal 137 to a connecting point 173, a second conductive strip line 175 extending from the receiver input terminal 155 to the connecting point 173, a third conductive strip line 177 extending from the connecting point 173 to the antenna terminal 161 and a fourth conductive strip line 179 extending from the connecting point 173 to the conductive layer 113. As the dielectric material plate 110 on which the thin conductive strip lines 171, 175, 177 and 179 are formed have a predetermined specific inductive capacity and the fourth conductive strip line is grounded, while a frequency signal is being applied to the duplex circuit 170, the conductive strip line 171, 175, 177 and 179 act as respective inductors whose respective magnitudes are dependent on their lengths.

Figure 2:
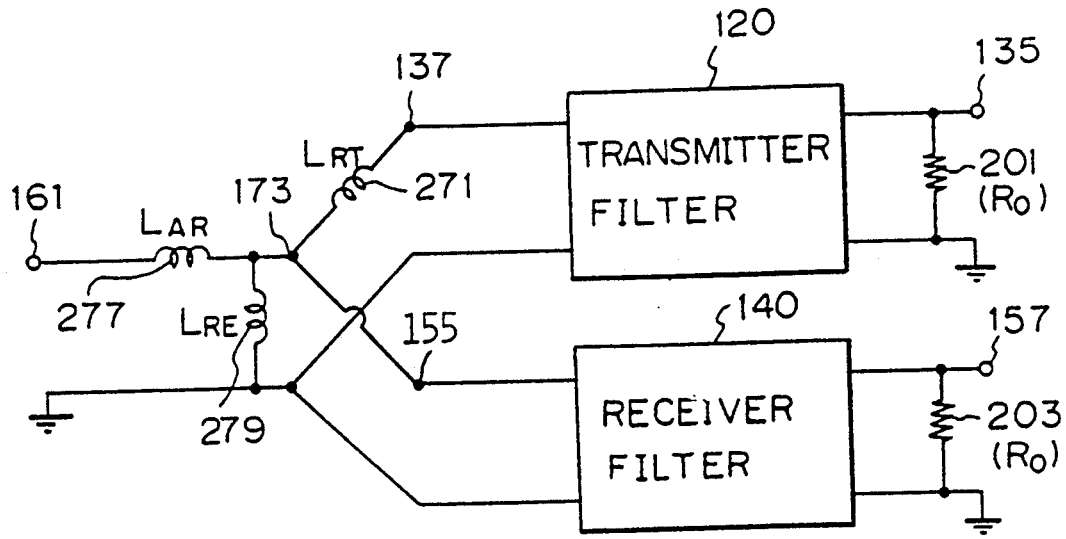
FIG. 2 is a schematic diagram of the duplexer shown in FIGS. 1 (a) and 1 (b)

Referring to FIG. 2, there is shown a schematic diagram of the duplexer 100. The terminal wires of the input terminal 135 of the transmitter filter 120 and the output terminal 157 of the receiver filter 140 connected to ground have terminal resistance (R0=50 ohm) represented in FIG. 2 as terminal resistors 201 and 203. The output terminal 137 of the transmitter filter 120 is connected to the connecting point 173 through a first inductor ($L_{RT}$) 271 which is created by the first conductive strip line 171 (see FIG. 1 (a)). The connecting point 173 is also connected to the input terminal 155, but no inductor is shown because the length therebetween of the second conductive strip line 175 in this embodiment is selected so that the inductance between the input terminal 155 and the connecting point 173 is small enough to be ignored. The connecting point 173 is connected to the antenna terminal 161 through a second inductor ($L_{AR}$) 277 which is formed by the third conductive strip line 177 and is further grounded through a third inductor ($L_{RE}$) 279 which is formed by the fourth conductive strip line 179.

Figure 3:
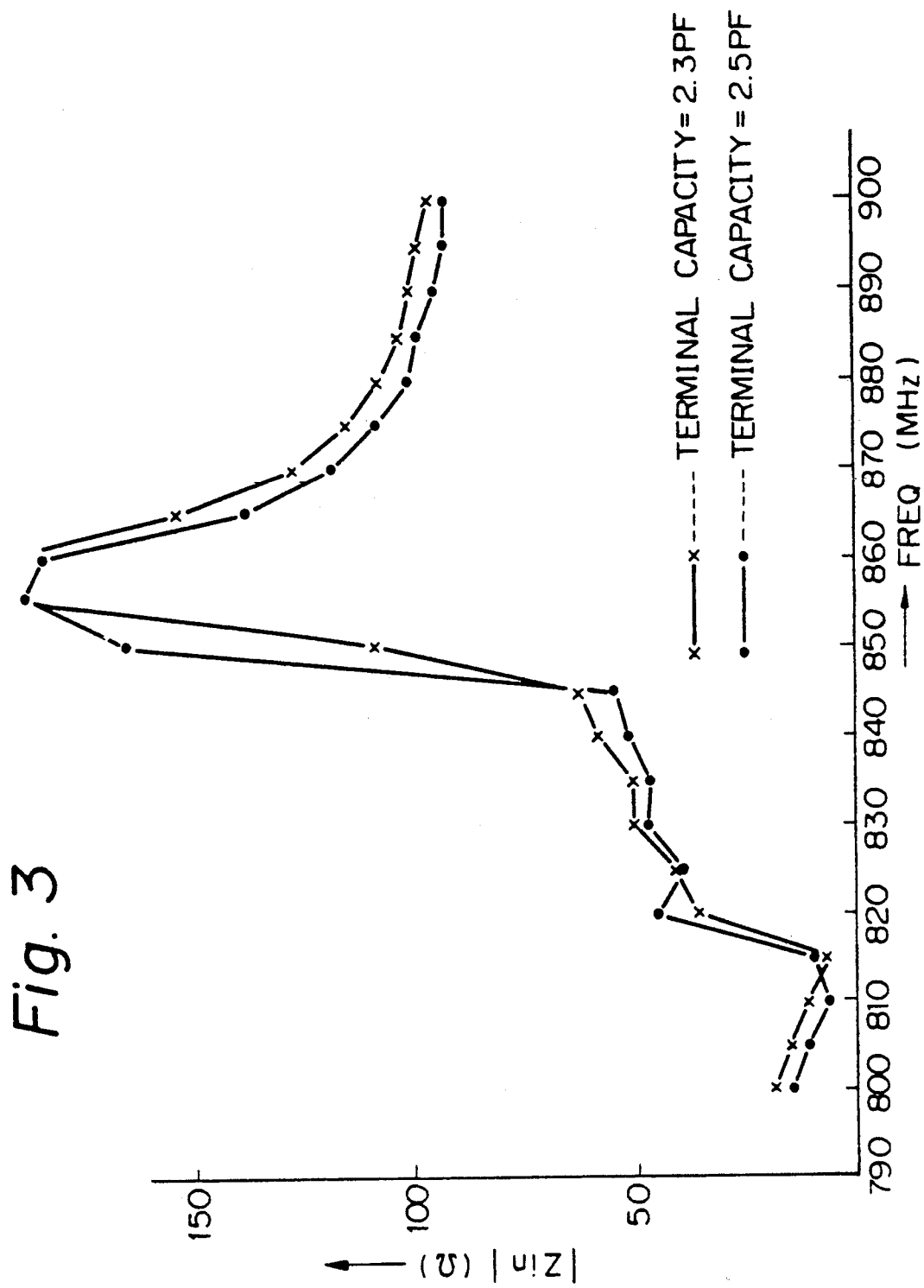
FIG. 3 is a graph illustrating the absolute values of the input impedance of a transmitter filter employed in the duplexer shown in FIGS. 1 (a) and 1 (b) in the range from 800 MHz to 900 MHz.
Figure 4:
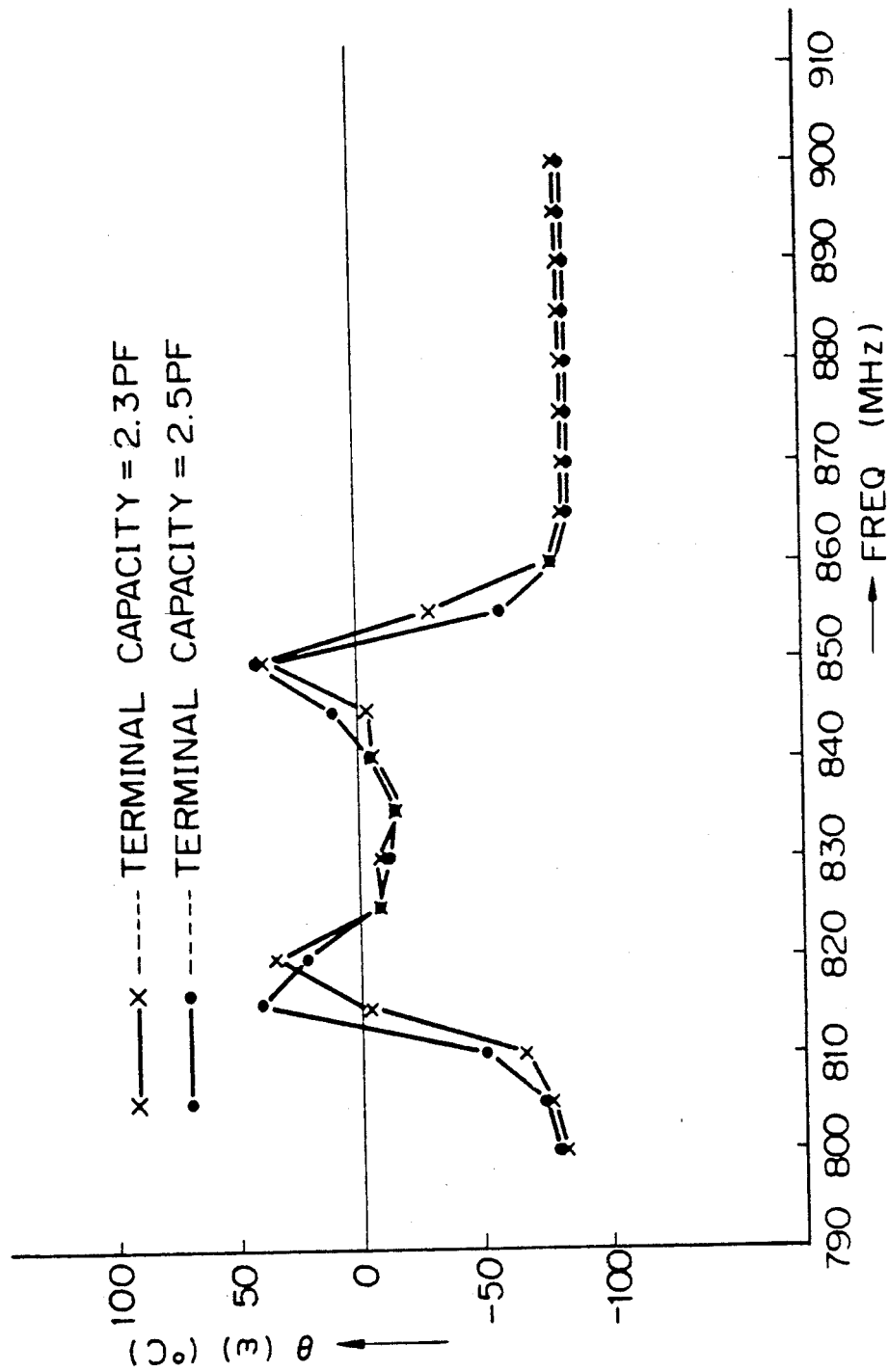
FIG. 4 is a graph illustrating the phase angles of the input impedance of a transmitter filter employed in the duplexer shown in FIGS. 1 (a) and 1 (b) in the range from 800 MHz to 900 MHz.

The transmitter filter 120 in this embodiment couples to the RF signals which have a frequency range from 825 MHz to 845 MHz and a central frequency ($f_0$) of 835 MHz and the absolute value ($|Zin|$) and the phase angle ($\theta(\omega)$) of the input impedance of such filters are shown by FIG. 3 and FIG. 4.

FIG. 3 shows absolute value ($|Zin|$) measurements of transmitter filter input impedance in the frequency range from 800 MHz to 900 MHz. As shown in FIG. 3, the absolute values of two transmitter filters, one of whose terminal capacity, set up between the input electrode 131 and the frequency adjusting layers 127 and between the output electrode 133 and the frequency adjusting layers 127, is 2.3 picofarad and the other is 2.5 picofarad, were found from test results to be respectively approximately 50 ohm within the coupled frequency range from 825 MHz to 845 MHz and to sharply increase above, and sharply decrease below the coupled frequency range.

FIG. 4 shows the phase angle ($\theta(\omega)$) of the transmitter filter input impedance characteristic in the same frequency range as in FIG. 3. As shown in FIG. 4, the phase angle of the two transmitter filters were both approximately zero degree within the coupled frequency range from 825 MHz to 845 MHz.

Figure 5:
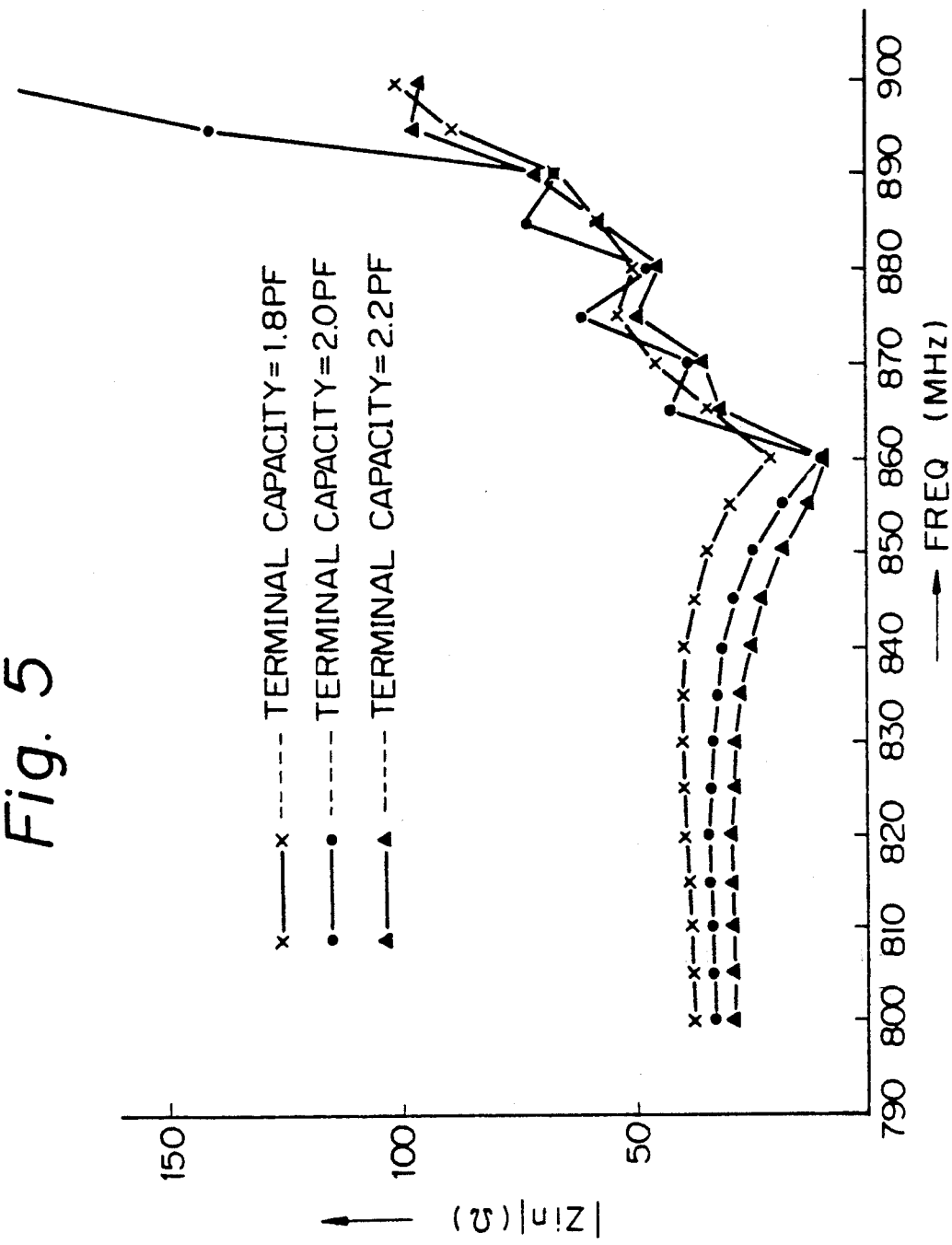
FIG. 5 is a graph illustrating the absolute values of the input impedance of a receiver filter employed in the duplexer shown in FIGS. 1 (a) and 1 (b) in the range from 800 MHz to 900 MHz.
Figure 6:
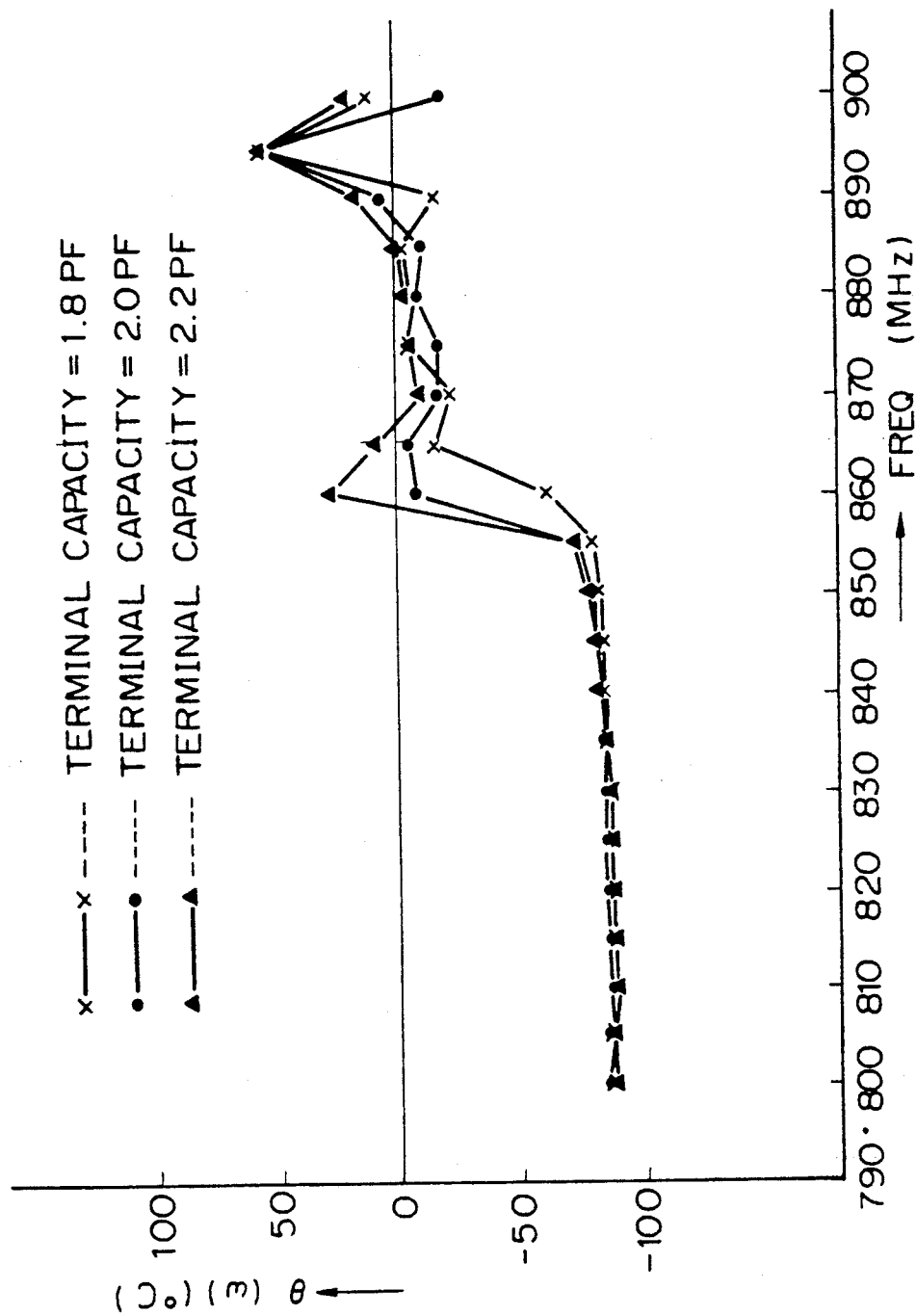
FIG. 6 is a graph illustrating the phase angles of the input impedance of a receiver filter employed in the duplexer shown in FIGS. 1 (a) and 1 (b) in the range from 800 MHz to 900 MHz.

The receiver filter 140 in this embodiment couples to the RF signals which have a frequency range from 870 MHz to 890 MHz and a central frequency ($f_0$) of 880 MHz and the absolute value ($|Zin|$) and the phase angle ($\theta(\omega)$) of its input impedance are shown by FIG. 5 and FIG. 6. FIG. 5 shows the absolute value ($|Zin|$) of the receiver filter input impedance in the frequency range from 800 MHz to 900 MHz. As shown in FIG. 5, the absolute values of the input impedance of three transmitter filters, one of whose terminal capacity, set up between the input electrode 151 and the frequency adjusting layers 147 and between the output electrode 153 and the frequency adjusting layers 147, is 1.8 picofarad, another is 2.0 picofarad and the third is 2.2 picofarad, were sach shown by tests to be approximately 50 ohms within the coupled frequency range from 870 MHz to 890 Mhz.

FIG. 6 shows the phase angle ($\theta(\omega)$) of the receiver filter input impedance in the same frequency range as in FIG. 5 for the above filters. As shown in FIG. 6, the phase angles of the three receiver filters are all approximately zero degree within the coupled frequency range from 870 MHz to 890 MHz.

It will be understood frim the following explanation that the duplexer 100 according to the invention can effectively isolate from each other the transmitter filter 120 and the receiver filter 140 having the foregoing input impedance characteristics.

Firstly, assuming that there is no inductor set up by the conductive strip lines, according to the FIGS. 3-6, the transmitter filter's input impedance ($Zin_{TX}$) and the receiver filter's input impedance ($Zin_{RX}$) can respectively be expressed by the following:

at the transmitter central frequency ($f_0$=835 MHz)

$$Zin_{TX}=50.0+j*0, \quad (6)$$

$$Zin_{RX}=0-j*30,$$

at the receiver central frequency ($f_0$=880 MHz)

$$Zin_{TX}=0-j*186.0 \text{ and} \quad (7)$$

$$Zin_{TX}=50.0+j*0.$$

The input impedance ($Zin_{ANT}$) of the parallel network comprised of the transmitter filter 120 and the receiver filter 140 and a return loss (RL) of the parallel network can be calculated in accordance with the following equations:

$$Zin_{ANT}=1/[(1/Zin_{TX})+(1/Zin_{RX})]; \text{ and} \quad (8)$$

$$RL=20 \log [(50+Zin_{ANT})/(50-Zin_{ANT})]$$

Substituting the values of $Zin_{TX}$ and $Zin_{RX}$ indicated in the equations (6) and (7) into equation (8) give:

at the transmitter central frequency ($f_0$=835 MHz)

$$Zin_{ANT}=13.235-j*22.058,$$

$$RL=3.88 \text{ (dB)},$$

at the receiver central frequency ($f_0$=880 MHz)

$$Zin_{ANT}=46.630-j*12.541 \text{ and}$$

$$RL=17.5 \text{ (dB)}.$$

From the foregoing it is apparent that an unsatisfactory input impedance ($Zin_{ANT}$) and return loss (RL) are obtained when inductive elements are not used in the parallel network the transmitter filter 120 and the receiver filter 140 and, especially, the return loss (RL) of the parallel network at the transmitter central frequency is low since the imaginary part of the receiver filter's input impedance ($Zin_{RX}$) is small.

Secondly, if the value ($L_{RT}$) of the first inductor 271 is assumed to by 5 (nH), then the input impedance ($Zin_{ANT}$) and the return loss (RL) of the parallel network are calculated to have the following values:

at the transmitter central frequency $$Zin_{ANT}=17.899-j*28.651,$$

$$RL=4.67 \text{ (dB)},$$

at the receiver central fraquency $$Zin_{ANT}=45.4545-j*14.341,$$

$$RL=16.15 \text{ (dB)}.$$

Thirdly, if the value ($L_{RE}$) of the third inductor 279 is assumed to be 20 (nH), then the input impedance ($Zin_{ANT}$) and the mismatching attenuation volume (RL) of the parallel network are calculated to have the following values:

at the transmitter central frequency $$Zin_{ANT}=32.2633-j*31.874,$$

$$RL=7.67 \text{ (dB)},$$

at the receiver central frequency $$Zin_{ANT}=49.14+j*6.7125 \text{ and}$$

$$RL = 23.34 \text{ (dB)}.$$

From foregoing, it is apparent that the real part of the parallel network's input impedance ($Zin_{ANT}$) is enlarged at the transmitter central frequency and the imaginary part of the parallel network's input impedance ($Zin_{ANT}$) is reduced at the receiver central frequency by the presence of the third inductor.

Finally if the value ($L_{AR}$) of the second inductor 277 is assumed to be 4 (nH), then the input impedance ($Zin_{ANT}$) and the return loss (RL) of the parallel network is calculated to have the following values:

at the transmitter central frequency $$Zin_{ANT} = 32.2633 - j^*10.888 \text{ and}$$

$$RL = 12.01 \text{ (dB)},$$

at the receiver central frequency $$Zin_{ANT} = 49.14 + j^*28.334 \text{ and}$$

$$RL = 11.08 \text{ (dB)}.$$

From foregoing, it is apparent that the imaginary part of the parallel network's input impedance ($Zin_{ANT}$) is reduced at the transmitter central frequency by the presence of the second inductor.

Therefore, from the above impedance and return loss values, the duplexer 100 is shown to effectively isolate the transmitter filter 120 and the receiver filter 140 because the return loss (RL) is sufficiently larger than 10 (dB), which is the minimum acceptable volume for use in a mobile telephone. The foregoing values of the inductors 271, 277 and 279 can be changed provided that the return loss is larger than the minimum acceptable volume.

When a duplexer circuit 170 whose coupled central frequency was 850 MHz, was formed on a glass-epoxy plate 110 whose thickness was 1.6 mm and specific inductive capacity (dielectric constant) was 4.8, with strip lines 171, 177 and 179 0.3 mm in width, then inductances of these strip lines $L_{RT} = 5$ nH, $L_{AR} = 4$ nH and $L_{RE} = 20$ nH were obtained by providing that the length of the first strip line 171 is 7.45 mm long, the length of the second strip line 177 is 6.73 mm long and the length of the third strip line 179 is 18.25 mm long.

The foregoing relation among the length (l) and the width (W) of the strip lines when measured in mm, and the inductance value (L) of the inductors when measured in nH can be expressed by the following equations:

let $W = 0.3$, then $L = 1.389\ 1 - 5.3443$, let $W = 0.5$, then $L = 1.092\ 1 - 2.4726$ and let $W = 0.7$, then $L = 1.0135\ 1 - 2.1753$.

If the duplexer circuit 170 is formed on the alumina plate, whose specific inductive capacity is 9.3, the length of the strip lins 171, 177 and 179 may further be shortened.

Figure 7:
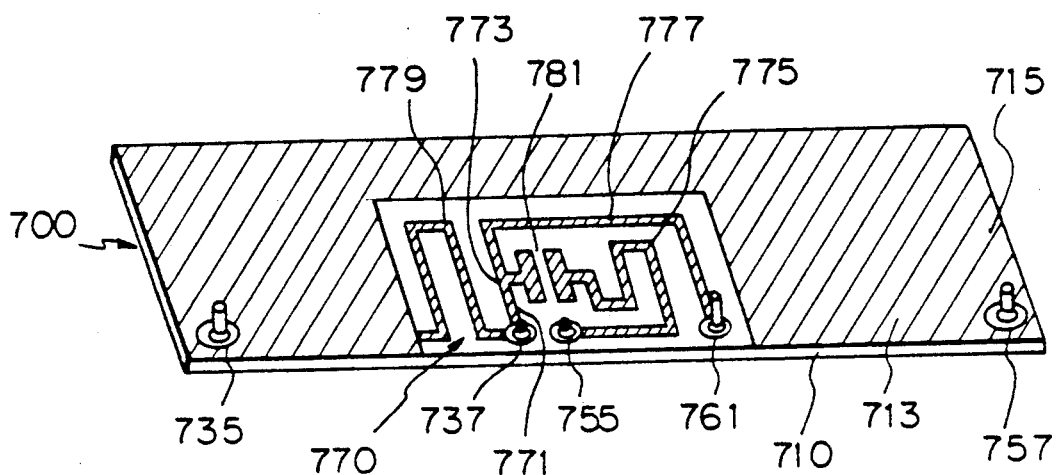
FIG. 7 is a bottom perspective view of a second embodiment of a duplexer in accordance with the invention.

Referring to FIG. 7, there is illustrated another example of a duplexer according to the invention. A duplexer 700 includes aplote 710 forming a dielectric material and having a predetermined specific inductive capacity. On one side of the dielectric material plate 710 (not shown in figure) are formed duplexer elements which are substantially the same as shown in FIG. 1(a).

On the side shown in FIG. 7, the surface 715 of the dielectric plate 710 is covered with a layer 713 of conductive material except for portions surrounding a duplex circuit 770 and areas surrounding respective throughholes which are adapted to receive a transmitter input terminal 735, a transmitter output terminal 737, a receiver input terminal 755, a receiver output terminal 757 and an antenna terminal 761. The conductive layer 713 covering the surface 715 of the dielectric plate 710 is to be grounded.

The duplexer circuit 770 formed on the dielectric plate includes a first thin conductive strip line 771 extending from the transmitter output terminal 737 to a connecting point 773, a one side of a second thin conductive strip line 775 extending from the receiver input terminal 755 to one side of a capacitance pattern 781, the other side of the capacitance pattern 781 being connected to the connecting point 773, a third thin conductive strip line 777 extending from the connecting line 773 to the antenna terminal 761, and a fourth conductive strip line 779 extending from the transmitter output terminal 737 to the conductive layer 713 of the dielectric material plate 710. Since the dielectric material plate on which the thin conductive strip lines 771, 775, 777 and 779 are formed has a predetermined specific inductive capacity and the fourth conductive strip line 779 is grounded, the conductive strip lines 771, 775 and 779 act as inductors whose respective magnitudes are dependent on their lengths, and the third conductive line 777 acts as a distributed constant line having a predetermined impedance, for example, 50 ohms.

Figure 8:
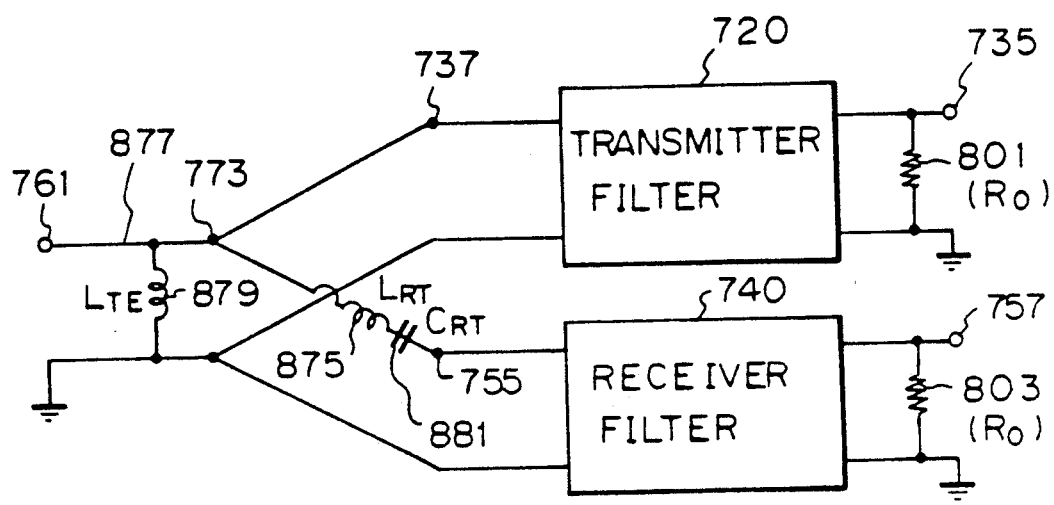
FIG. 8 is a schematic diagram of the duplexer shown in FIG. 7.

Referring to FIG. 8, there is shown a schematic diagram of the duplexer 700. The input terminal 735 of a transmitter filter 720 and the output terminal 757 of a receiver filter 740 have terminal resistances ($R_0 = 50$ ohms) respectively represented in FIG. 8 as terminal resistors 801 and 803. Comparing FIGS. 7 and 8, output terminal 737 of the transmitter filter 720 is connected to the connecting point 773 through the first conductive strip line 771 whose length in this embodiment is selected so that the inductance created thereby between the output terminal 737 and the connecting point 773 is small enough to be ignored. The connecting point 773 is also connected to the input terminal 755 of the receiver filter 740 through the second conductive strip line 775 whose inductance $L_{RT}$ is represented by a first inductor 875, and the capacitance pattern 781 represented by a capacitor 881. The connecting point 773 is connected to the antenna terminal 761 through the distributed constant line 877 formed by the third conductive strip line 777 and is further grounded through the fourth conductive strip line 779 whose inductance $L_{TE}$ is represented by a second inductor 879.

The transmitter filter 720 in this embodiment couples to the RF signals which have a frequency range from 825 MHz to 845 MHz and a central frequency ($f_0$) of 835 MHz and the absolute value ($|Zin|$) and the phase angle ($\theta(\omega)$) of its input impedance are the same as in the first embodiment and are shown by FIG. 3 and FIG. 4.

The receiver filter 740 in this embodiment couples to the RF signals which have a frequency range from 870 MHz to 890 MHz and a central frequency ($f_0$) of 880 MHz and the absolute value ($|Zin|$) and the phase angle ($\theta(\omega)$) of its input impedance are the same as in the first embodiment and are shown by FIG. 5 and FIG. 6.

It will be understood from the following explanation that the duplexer 700 according to the present invention can effectively isolate from each other the transmitter filter 720 and the receiver filter 740 having the foregoing input impedance characteristic thereof.

Assuming that there is no inductor set up by the conductive strip lines 775 and 779 and also no capacitor set up by the capacitance pattern 781, according to the FIGS. 3-6 the transmitter filter's input impedance ($Zin_{TX}$) and the receiver filter's input impedance ($Zin_{RX}$) can respectively be expressed as follows:

at the transmitter central frequency ($f_0 = 835$ MHz)

$$Zin_{TX} = 50.0 + j*0, \quad (9)$$

$$Zin_{RX} = 0 - j*30,$$

at the receiver central frequency ($f_0 = 880$ MHz)

$$Zin_{TX} = 0 - j*186.0 \text{ and} \quad (10)$$

$$Zin_{RX} = 50.0 + j*0,$$

An input impedance ($Zin_{ANT}$) of the parallel network comprised of the transmitter filter 720 and the receiver filter 740 and a mismatching attenuation volume (RL) can be calculated in accordance with the same equations (8) given above, that is:

$$Zin_{ANT} = 1/[(1/Zin_{TX}) + (1/Zin_{RX})]; \text{ and} \quad (8)$$

$$RL = 20 \log [(50 + Zin_{ant})/(50 - Zin_{ANT})].$$

Substituting the above impedance values (9) and (10) into equation (8), give:

at the transmitter central frequency ($f_0 = 835$ MHz)

$$Zin_{ANT} = 13.235 - j*22.058,$$

$$RL = 3.88 \text{ (dB)},$$

at the receiver central frequency ($f_0 = 880$ MHz)

$$Zin_{ANT} = 46.630 - j*12.541 \text{ and}$$

$$RL = 17.5 \text{ (dB)},$$

From the foregoing it is apparent that the inferior input impedance ($Zin_{ANT}$) loss return loss (RL) are obtained when inductive and capacitive elements are not used in the parallel network of the transmitter filter 720 and the receiver filter 740 and, especially, the return loss (RL) of the parallel network at the transmitter central frequency is decreased owing to the fact that the imaginary part of the receiver filter's input impedance ($Zin_{RX}$) is small.

Now, if the first inductor 875 and the capacitor 881 are present, the second inductor 879 is absent, the value ($L_{RT}$) of the first inductor 875 is 4.5 (nH) and the value ($C_{RT}$) of the capacitor 881 is 7.2 (PF) in order to enlarge the imaginary part of the receiver filter's input impedance ($Zin_{RX}$) at the transmitter central frequency, then the input impedance ($Zin_{ANT}$) and the return loss (RL) of the parallel network are calculated to have the following values:

at the transmitter central frequency $$Zin_{ANT} = 27.434 - j*24.833,$$

$$RL = 7.68 \text{ (dB)},$$

at the receiver central frequency $$Zin_{ANT} = 46.62 - j*12.53,$$

$$RL = 17.51 \text{ (dB)}.$$

If in addition the second inductor 879 is present and the value ($L_{TE}$) of the second inductor 879 is 16.18 (nH) in order to reduce the imaginary part of the parallel network's input impedance ($Zin_{ANT}$) at the transmitter central frequency, then the input impedance ($Zin_{ANT}$) and the return loss (RL) of the parallel network are calculated to have the following values:

at the transmitter central frequency $$Zin_{ANT} = 45.455 - j*14.45,$$

$$RL = 16.08 \text{ (dB)},$$

at the receiver central frequency $$Zin_{ANT} = 46.083 + j*13.37 \text{ and}$$

$$RL = 16.86 \text{ (dB)},$$

From the foregoing, it is apparent that the duplexer 700 effectively isolates the transmitter filter 720 and the receiver filter 740 from each other because the return loss (RL) is sufficiently larger than 10 (dB) (the minimum acceptable volume for a mobile telephone). The foregoing values of the inductors 875 and 879 and the capacitor 881 can be changed provided that the return loss is larger than the minimum acceptable volume (10 dB). The physical dimensions of duplex circuit 770 according to the present invention are suitably substantially the same as those of the duplex circuit 170 described above.

Figure 9:
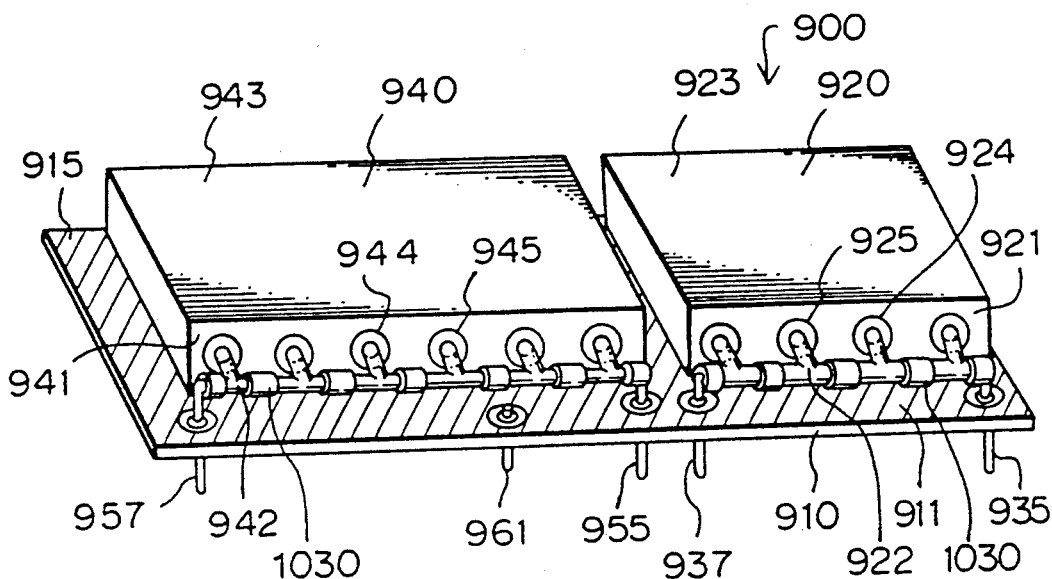
FIG. 9 (a) is a top perspective view of a third embodiment of a duplexer in accordance with the invention.
Figure 9:
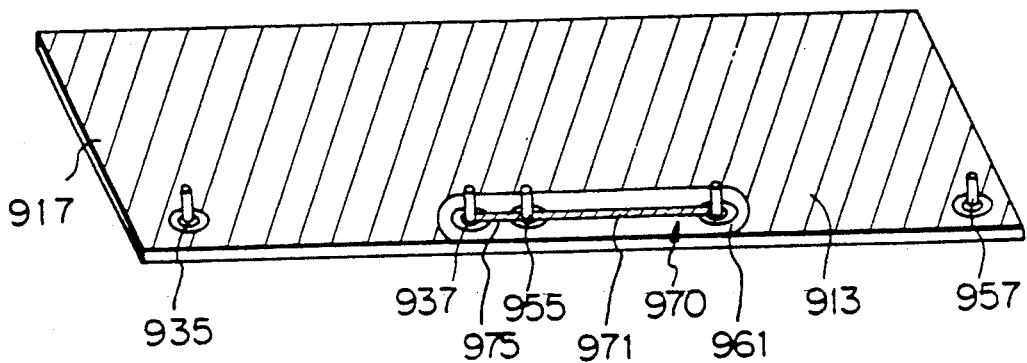

FIGS. 9(a) and 9(b) illustrate opposite sides of a duplexer 900 whose elements in accordance with a third embodiment of the invention are formed on opposite sides 915 and 917 of a dielectric material plate 910.

Figure 10:
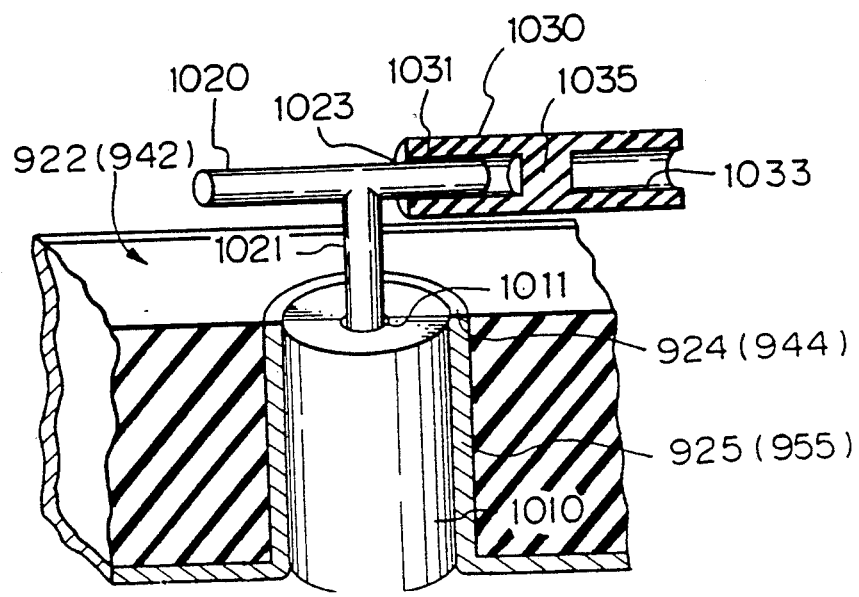
FIG. 10 is a perspective view of a coupling terminal employed in the duplexer shown in FIG. 9 (a)

Referring to the FIG. 9(a), the dielectric plate 910 is formed of alumina or glass-epoxy resin material and mounts a transmitter dielectric filter 920 and a receiver dielectric filter 940 on the surface 915 thereof. The transmitter filter 920 and the receiver filter 940 respectively include a substantially rectangularly shaped block of ceramic material, primarily BaO and TiO, whose outer surface is covered with a layer of a conductive material such as a silver or copper, except for the respective front surfaces 921 and 941, so as to form outer conductive layers 923 and 943. The filters 920 and 940 also have respective front-to-rear extending throughholes 924 and 944 whose cylindrical interior surfaces are respectively entirely covered with conductive material so as to form inner conductive layers 925 and 945 which are electrically connected to the respective outer layers 923 and 943 on the rear surface of filters 920 and 940 respectively opposite front surfaces 921 and 941. The transmitter filter 920, as shown in FIG. 9(a), has four such inner conductive layers 925. The transmitter filter 920 further has four coupling terminals 922 which are respectively inserted into the corresponding cylindrical throughholes 924 in contact with the inner conductive layers 925. As shown in FIG. 10, each of the coupling terminals 922 includes a cylindrically shaped bushing 1010, made of dielectric material such as polypropylene, polycarbonate, epoxy resin, ABC' resin, etc., and having a thin round recess 1011, and a T-shaped conductive part 1020 whose first edge portion such as a leg 1021 is inserted into the recess 1011 of the bushing 1010. Each of the coupling terminals 922 is capacitively coupled to the adjacent coupling terminals 922 through a cylindrical solid insulator 1030 made of ceramic materials. The solid insulator 1030 has thin round recesses 1031 and 1033 at its respective ends which are partitioned by a partition portion 1035. The solid insulator 1030 acts as a capacitor while a second edge portion such as an arm 1023 of the conductive part 1020 and an arm of the adjacent conductive part (not shown) are respectively inserted into each of the recesses 1031 and 1033 and these conductive parts 1020 are coupled to RF signals.

Each of the inner conductive layers 925 and the respective coupling terminal 922 mounted therein, surrounded by the dielectric material enclosed in the outer conductive layers 923, acts as a dielectric resonator. By appropriate selection or modification of the solid insulator 1030, the capacitance and therefore the magnitude of coupling between adjacent resonators may by adjusted. The transmitter filter 920 further has an input terminal 935 and an output terminal 937 which are respectively coupled to the coupling terminal 922 mounted adjacent the side edges of the front surface 921 through the solid insulator 1030.

The receiver filter 940 has six inner conductive layers 945 connected to the outer conductive layer 943 at the rear surface. The receiver filter 940 further has six coupling terminals 942 which are identical to the coupling terminal 922 in transmitter filter 920 and which are respectively inserted into six corresponding throughholes 944 having their cylindrical interior surfaces covered with the inner conductive layers 945. Each of the inner conductive layers 945 and the coupling terminals 942 therein, surrounded by the dielectric material enclosed in the outer conductive layers 943, acts as a dielectric resonator. The coupling magnitude between adjacent resonators in the receiver filter 940 are adjusted in the same manner as in the transmitter filter 920 with the use of the solid insulators 1030. The receiver filter 940 further has an input terminal 955 and an output terminal 957 which are respectively coupled to the coupling terminal 942 mounted adjacent to the side edges of the front surface 941, through the solid insulator 1030.

The upper surface 915 shown in FIG. 9a of the dielectric plate 910 is entirely covered with a layer 911 of conductive material except for portions surrounding throughholes which are adapted to receive the transmitter input terminal 935, the transmitter output terminal 937, the receiver input terminal 955, the receiver output terminal 957 and an antenna terminal 961. The conductive layer 911 covering the dielectric plate 910 is to be grounded and is connected to each of the outer conductive layers 923 and 943 by means of a conductive adhesive or solder along bottom surfaces of the filters 920 and 940 so as to also ground the outer conductive layers 923 and 943.

The other surface 917 of the dielectric plate 910 is also covered with a layer 913 of the conductive material except for portions respectively surrounding a duplex circuit 970 and throughholes which are adapted to received the transmitter input terminal 935, the transmitter output terminal 937, the receiver input terminal 955, the receiver output terminal 957 and the antenna terminal 961. The conductive layer 913, like layer 911, is to be grounded.

A duplexer circuit 970 is formed on the surface of the dielectric plate 910 and includes a first conductive strip line 971 extending from the transmitter output terminal 937 to the antenna terminal 961 and a second conductive strip line 975 extending from the receiver input terminal 955 to the transmitter terminal 955. The conductive strip lines 971 and 975 act as distributed constant lines (typically 50 ohm lines) whose lengths are selected to be sufficiently short so as to allow to pass RF signals whose frequencies belong to either the transmitter frequency band or the receiver frequency band.

Figure 11:
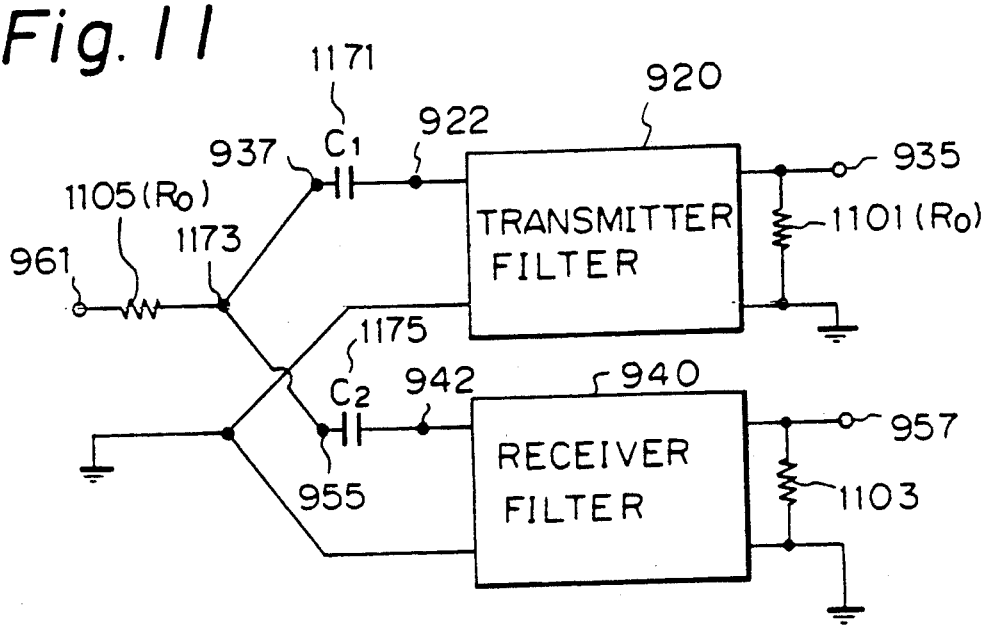
FIG. 11 is a schematic diagram of the duplexer shown in FIGS. 9 (a) and 9 (b)

Referring to FIG. 11, there is shown a schematic diagram of the duplexer 900. The input terminal 935 of the transmitter filter 920 and the output terminal 957 of the receiver filter 940 have respective terminal resistances represented by resistors 1101 and 1103 ($R_0 = 50$ ohm). The output terminal 937 of the transmitter filter 920 is connected to a connecting point 1173 and connected to the coupling terminal 922 through a first capacitance ($C_1$) 1171 set up by the solid insulator 1030, provided between the transmitter output terminal 937 and the conductive part 1020 of the coupling terminal 922. The connecting point 1173 is also connected to the receiver input terminal 955 which is connected to the coupling terminal 942 through a second capacitance ($C_2$) 1175 set up by the solid insulator 1030, provided between the receiver input terminal 955 and the conductive part 1020 of the coupling terminal 942. The connecting point 1173 is further connected to the antenna terminal 961 through a terminal resistance represented by a resistor 1105 ($R_0 = 50$ ohms).

Figure 12A:
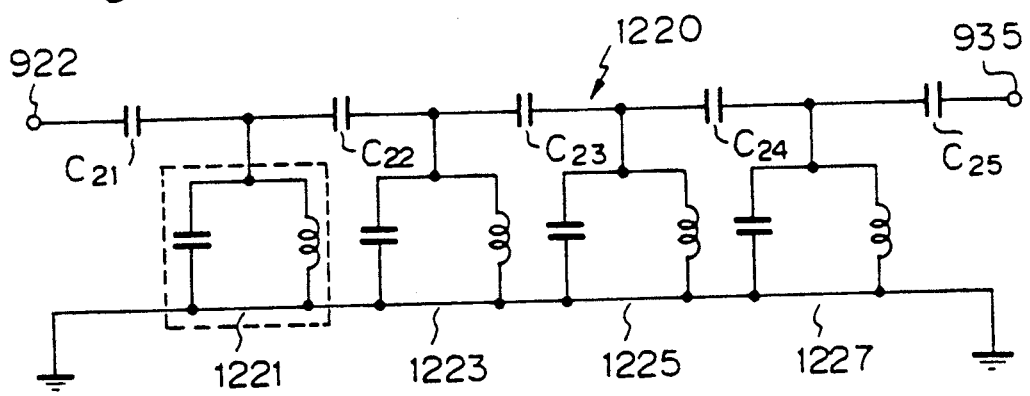
FIG. 12 (a) is an equivalent circuit of a transmitter filter employed in the duplexer shown in FIGS. 9 (a) and 9 (b)

The transmitter filter 920 can be shown by a lumped constant equivalent circuit 1220 in FIG. 12(a). The equivalent circuit 1220 has four resonator circuits 1221, 1223, 1225 and 1227. Each of the resonator circuits, including a capacitance and an inductance, is coupled to adjacent resonators by means of capacitances $C_{22}$, $C_{23}$, $C_{24}$ set up by the solid insulator 1030 and the bushing 1010. The resonator circuit 1221 is coupled to the coupling terminal 922 through a capacitacne $C_{21}$ (0.708 pF in the exemplary embodiment discussed below) set up by the bushing 1010, and the resonator 1227 is also coupled to the input terminal 935 through a capacitance $C_{25}$.

Figure 12B:
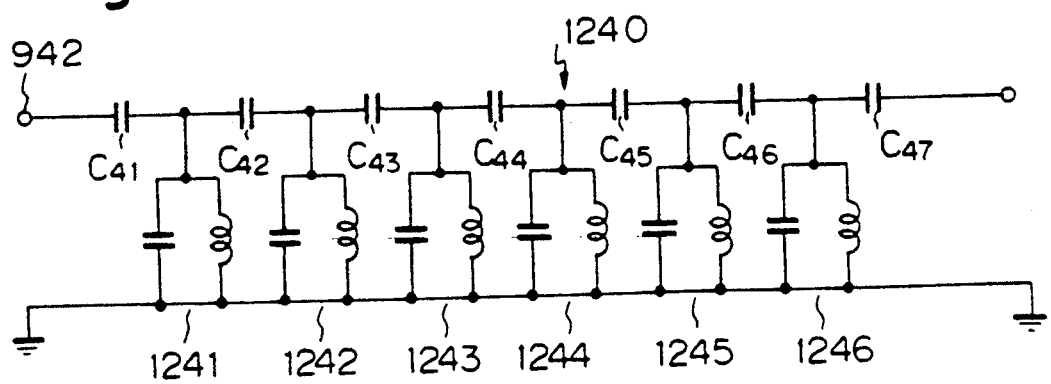

The receiver filter 940 can also be shown by a lumped constant equivalent circuit 1240 in FIG. 12(b). The equivalent circuit 1240 has six resonator circuits 1241, 1242, 1243, 1244, 1245 and 1246. Each of the resonator circuits, including a capacitance and an inductance, is coupled to adjacent resonators by means of capacitance $C_{42}$, $C_{43}$, $C_{44}$, $C_{45}$, $C_{46}$, set up by the solid insulator 1030 and the bushing 1010. The resonator circuit 1241 is coupled to the coupling terminal 922 through a capacitance $C_{41}$ (0.662 pF in the exemplary embodiment) set up by the bushing 1010, and the resonator 1247 is also coupled to the input terminal 957 through a capacitance $C_{47}$.

Figure 13:
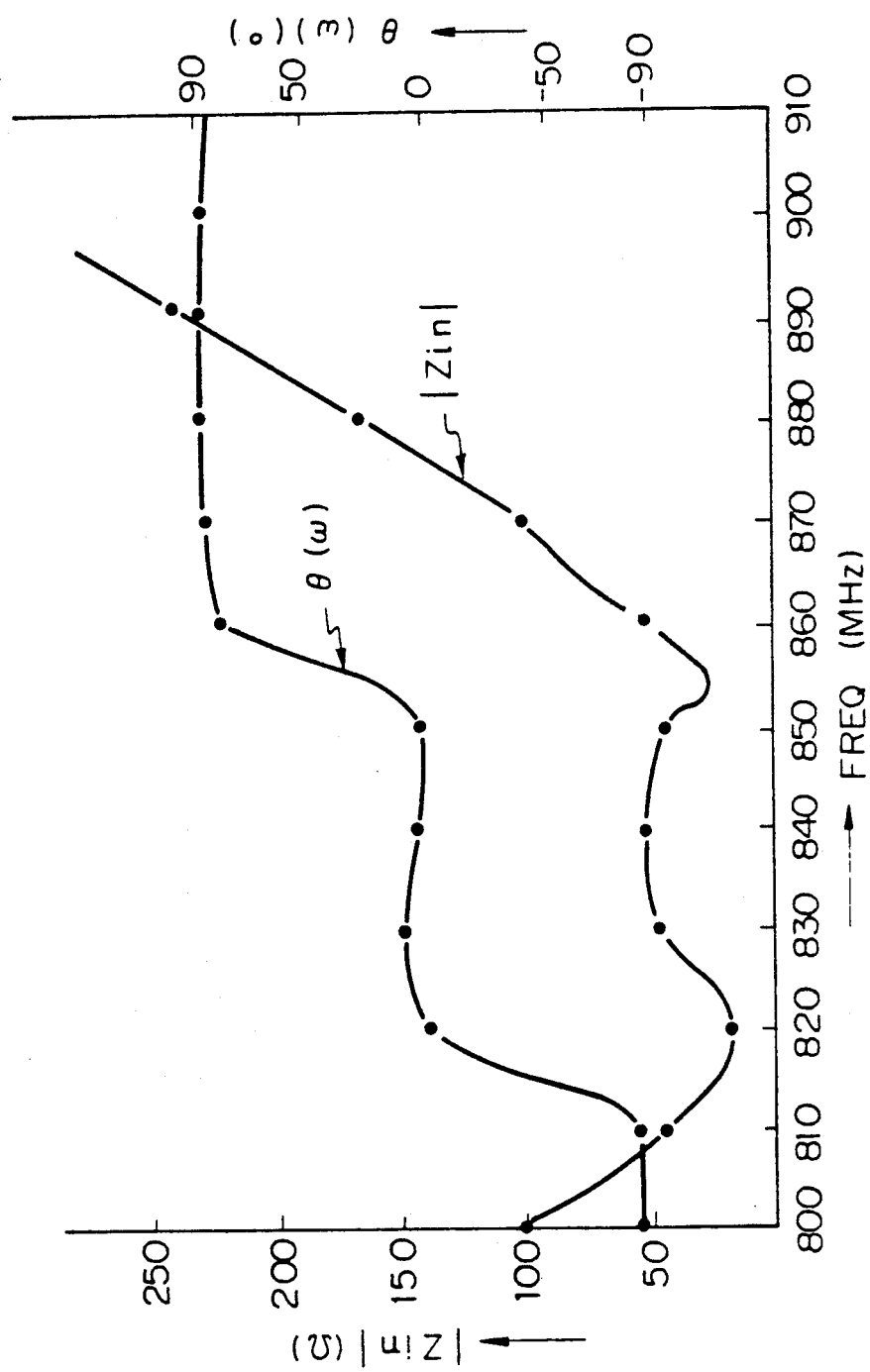
FIG. 13 is a graph illustrating the absolute values and the phase angles of the input impedance of a transmitter filter employed in the duplexer shown in FIGS. 9 (a) and 9 (b) in the range from 800 MHz to 910 MHz.

The transmitter filter 920 in this embodiment couples to the RF signals which have the frequency range from 825 MHz to 845 MHz and the central frequency ($f_0$) 835 MHz and the absolute value ($|Z_{in}|$) and the phase angle ($\theta(\omega)$) of its input impedance characteristic for the exemplary embodiment is shown by FIG. 13. FIG. 13 shows the absolute value ($|Z_{in}|$) and the phase angle ($\theta(\omega)$) of the transmitter filter input impedance in the frequency range from 800 MHz to 910 MHz. As shown in FIG. 13, the absolute value of the impedance of the transmitter filter 920 is approximately 50 ohms within the coupled frequency range from 825 MHz to 845 MHz and increases sharply outside of the coupled frequency range. The phase angles of the transmitter filter are approximately zero degree within the coupled frequency range from 825 MHz to 845 MHz and take on sharply higher and lower values above and below this range.

Figure 14:
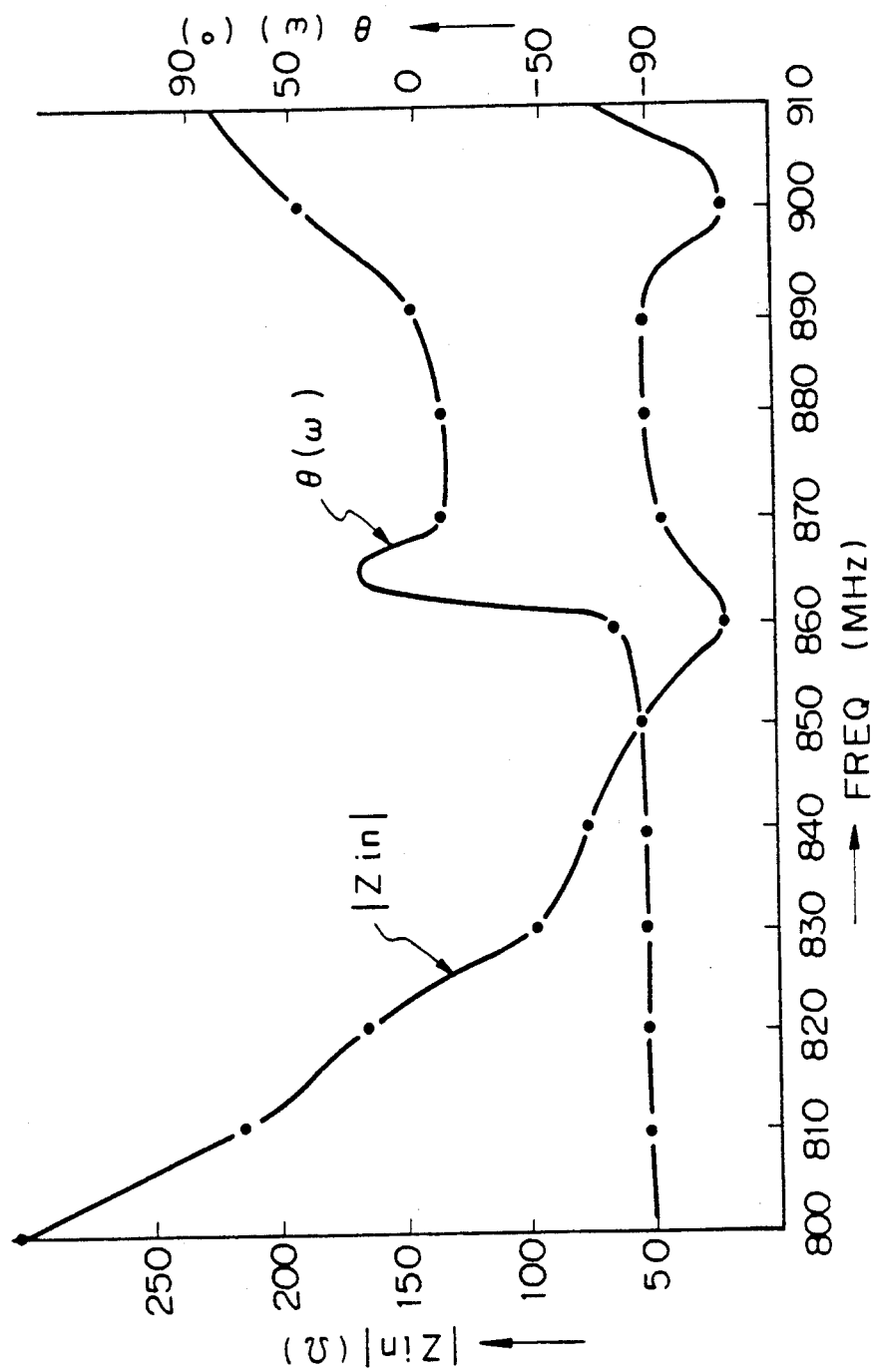
FIG. 14 is a graph illustrating the absolute values and the phase angles of the input impedance of a receiver filter employed in the duplexer shown in FIGS. 9 (a) and 9 (b) in the range from 800 MHz to 910 MHz.

The receiver filter 940 in this exemplory embodiment couples to the RF signals which have the frequency range from 870 HMz to 890 MHz and the central frequency ($f_0$) 880 Mhz and the absolute value ($|Zin|$) and the phase angle ($\theta(\omega)$) of its input impedance characteristic is shown by FIG. 14. FIG. 14 shows the absolute value ($|Zin|$) and the phase angle ($\theta(\omega)$) of the receiver filter input impedance in the frequency range from 800 MHz to 910 MHz. As shown in FIG. 14, the absolute value of the impedance of the receiver filter 940 is approximately 50 ohms and the phase angle is approximately zero within the coupled freqnecy range from 870 Mhz to 890 MHz.

It can be seen from the following explanation that the duplexer 900 according to the present invention can effectively isolate the transmitter filter 920 and the receiver filter 940 having the foregoing input impedance.

Firstly, assuming that the capacitance values $C_1$ and $C_2$ are zero and the characteristic impedance of each of the transmitter filter and receiver filter is one ohm for purposes of simplification, according to the FIGS. 13 and 14, the transmitter filter's input impedance ($Zin_{TX}$) and the receiver filter's input impedance ($Zin_{RX}$) can respectively be expressed by the following equations:

at the transmitter central frequency ($f_0 = 835$ MHz)

$$Zin_{TX} = 1.0 + j*0,$$

$$Zin_{RX} = 0. - j*X_2,$$

at the receiver central frequency ($f_0 = 880$ MHz)

$$Zin_{TX} = 0 + j*X_1 \text{ and}$$

$$Zin_{RX} = 1.0 + j*0,$$

wherein
$X_1$ is the reactance value of the receiver filter,
and $X_2$ is the reactance value of the transmitter filter.

An input admittance ($Yin_{ANT}$) of the network comprised of the transmitter filter 920, the receiver filter 940 and the duplex circuit 970 including the first capacitance ($C_1$) and the second capacitance ($C_2$) can be expressed by the following equations in accordance with the foregoing equations:

at the transmitter central frequency ($f_0 = 835$ MHz)

$$\begin{aligned} Yin_{ANT} &= 1/[(1/j\omega C_1) + Zin_{TX}] + \\ &\quad 1/[(1/j\omega C_2) + Zin_{RX}] \\ &= (\omega^2 C_1^2)/[1 + (\omega^2 C_1^2)] + \\ &\quad j\{\omega C_1/[1 + (\omega^2 C_1^2)] + \\ &\quad \omega C_2/[1 + (\omega C_2 X_2)]\}, \end{aligned}$$

and if $\omega C_2 X_2 \gg 1$, then $$Yin_{ANT} = (\omega^2 C_1^2)/[1 + (\omega^2 C_1^2)] + \quad (11)$$

$$j\{\omega C_1/[1 + (\omega^2 C_1^2)] + 1/X_2\},$$

and the receiver central frequency ($f_0 = 880$ MHz), $$\begin{aligned} Yin_{ANT} &= 1/[(1/j\omega C_1) + Zin_{TX}] + \\ &\quad 1/[(1/j\omega C_2) + Zin_{RX}] \\ &= (\omega^2 C_2^2)/[1 + (\omega^2 C_2^2)] + \\ &\quad j\{\omega C/[1 + (\omega^2 C_2^2)] + \\ &\quad \omega C_1/[1 - (\omega C_1 X_1)]\}, \end{aligned}$$

and if $\omega C_1 X_1, \gg 1$ then $$Yin_{ANT} = (\omega^2 C_2^2)/[1 + (\omega^2 C_2^2)] + \quad (12)$$

$$j\{\omega C/[1 + (\omega^2 C_2^2)] - 1/X_1\},$$

wherein $\omega$ is $2\pi f_0$.

In order to improve the input impedance of the network without a change of the input impedance of each of the transmitter filter 920 and the receiver filter 940, the value ($C_1$) of the first capacitance and the value ($C_2$) the second capacitance should be determined so as to let of the imaginary components of both equations (11) and (12) = 0 and can be calculated by the following equations:

The imaginary components of equation (11)

$$= \omega C_1/[1+(\omega^2 C_1^2)] + 1/X_2 = 0$$

assume $\omega^2 C_1^2 \ll 1$: and then $$C_1 = -1/(\omega X_2) \quad (13)$$

The constant term of the imaginary components of equation (12)

$$= \omega C_2/[1+(\omega^2 C_2^2)] - 1/X_1 = 0$$

assume $\omega^2 C_2^2 \ll 1$: and then $$C_2 = 1/(\omega X_1). \quad (14)$$

From the foregoing equations (13) and (14), $C_1 = -5$ (pF) and $C_2 = 5$ (pF).

Figure 15:
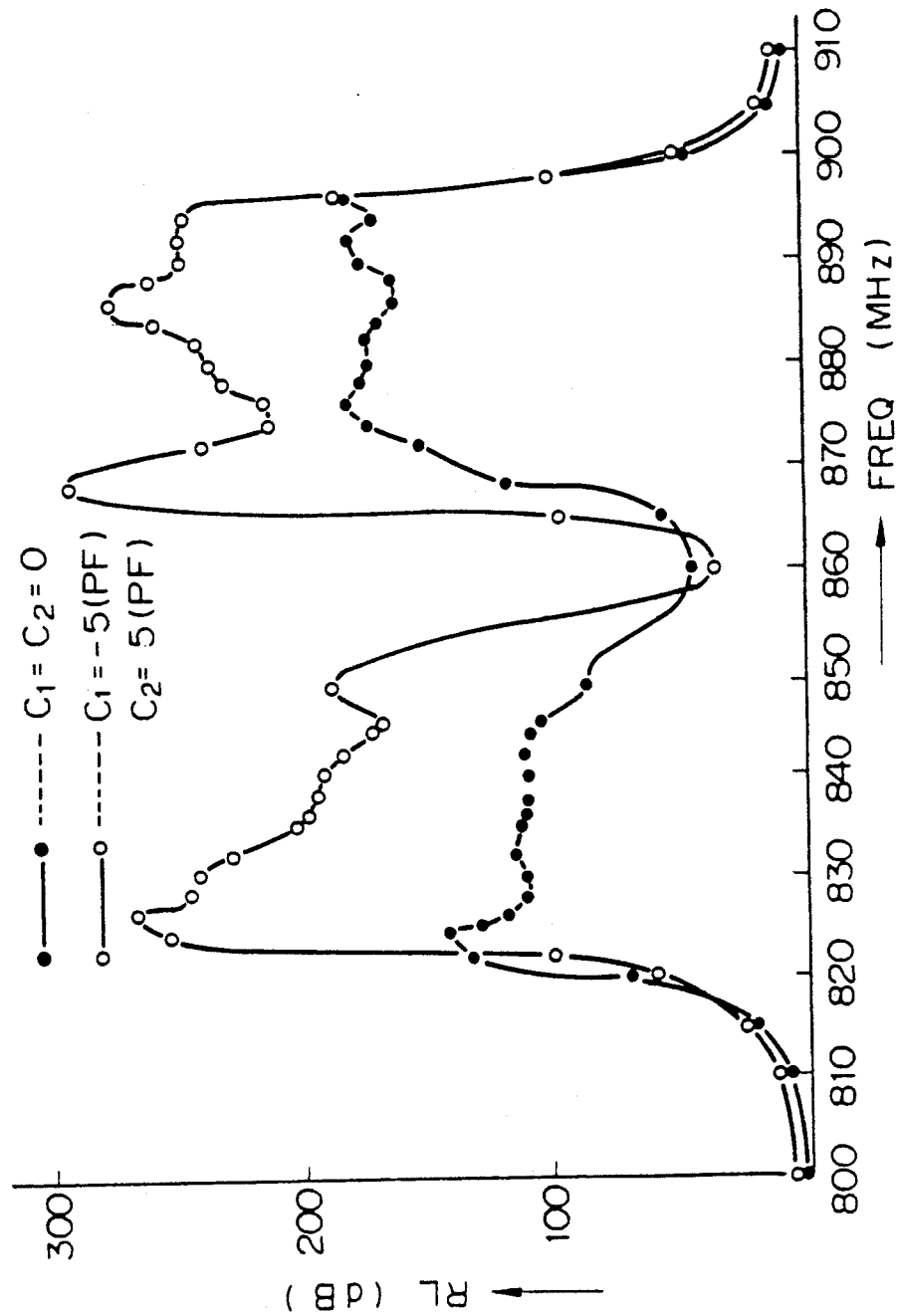
FIG. 15 is a graph illustrating the return loss of the duplexer shown in FIGS. 9 (a) and 9 (b).

The return loss (RL) of the network is shown in FIG. 15. FIG. 15 shows the return loss (RL) of the network in case of either $C_1 = C_2 = 0$ (pF) or $C_1 = -5$ (pF) and $C_2 = 5$ (pF) in the frequency range from 800 MHz to 900 MHz. As shown in FIG. 15, the return loss (RL) of the network in the case of $C_1 = -5$ (pF) and $C_2 = 5$ (pF) are greatly superior to that of the network in the case of $C_1 = C_2 = 0$ (pF).

The first capacitance $C_1$ and the second capacitance $C_2$ set up by the solid insulator 1030, are respectively combined with the capacitances $C_{21}$ (0.708 pF in the exemplary embodiment) and $C_{41}$ (0.662 pF in the exemplary embodiment) set up by the bushing 1010 and the combined capacitances are respectively 0.825 (pF) and 0.585 (pF).

Therefore, the duplexer 900 is shown to effectively isolate the transmitter filter 920 and the receiver filter 940 because the return loss (RL) in the coupled ranges from 825 MHz to 845 MHz and from 870 MHz to 890 MHz is sufficiently larger than the minimum acceptable volume for a mobile telephone of 10 (dB). The foregoing values of the capacitances $C_1$ $C_2$, $C_{21}$ and $C_{41}$ can be changed provided that the return loss is larger than the minimum acceptable volume.

The present disclosure relates to the subject matter disclosed in Japanese Patent Application Nos. 62-215047, 62-215048 and 62-215049 of Aug. 31st, 1987 the entire disclosure of which is incorporated herein by reference.

It will be understood that the above description of the present invention is susceptible to various modification, changes and adaptations, and the same are intended to be comprehended within the meaning and range of equivalents of the appended claims.

For example, the invention can also be adapted to a diplexer which isolates a first frequency signal in a first frequency range, and a second frequency signal in a second frequency range which is non-overlapping with the first frequency range. In a diplexer, as is known, the first frequency signal and second frequency signal, respectively received by a first filter and a second filter, are both transmitted by or received from a common antenna terminal. Therefore, in one application of the invention in the case of transmitting the signals via the antenna, the output terminal of the first filter is connected to the antenna terminal through an inductor, or an inductor and capacitor, and the output terminal of the second filter is also electrically connected to the antenna terminal. Alternatively, both output terminals may be connected to be antenna terminal through capacitors. On the other hand, in another application of invention in the case of receiving the first and second frequency signals from the antenna, the input terminal of the first filter is connected to the antenna terminal through an inductor, or an inductor and capacitor, and the input terminal of the second filter is also electrically connected to the antenna terminal, and alternatively, both input terminals may be connected to the antenna terminal through capacitors. In each of the cases, the use of inductors and/or capacitors, permits a reduction in the size of a diplexer, similarly to the result of their use in duplexers as described above.

What is claimed is:

1. An isolating circuit for isolating a first frequency signal in a first frequency range and a second frequency signal in a second frequency range which is non-overlapping with the first frequency range, the isolating circuit comprising:
   an antenna terminal;
   a first filter having a first input terminal for coupling the first frequency signal thereto, and a first output terminal;
   a second filter having a second input terminal for coupling the second frequency signal thereto, and a second output terminal;
   first and second connecting means respectively connecting the first input terminal and the second output terminal to a connecting point, one of said first and second connecting means being a first inductor;
   a second inductor connected to the connecting point for connecting the connecting point to ground; and
   a third inductor connecting the connecting point to the antenna terminal.

2. The circuit according to claim 1, wherein the first inductor, the second inductor and the third inductor have inductances respectively given so that the circuit has a return loss which is larger than 10 dB at each frequency of the first frequency signal and the second frequency signal.

3. The circuit according to claim 2, wherein the circuit includes a dielectric plate, the first, second and third inductors respectively comprising first, second, and third strip lines formed on the dielectric plate.

4. The circuit according to claim 3, wherein the dielectric plate has a plurality of throughholes, respective ones of the throughholes receiving the first input terminal, the first output terminal, the second input terminal, the second output terminal and the antenna terminal, the circuit further comprising a conductive layer covering the dielectric plate except for portions surrounding the first strip line, the second strip line, the third strip line and the throughholes, the second strip line being connected to the conductive layer.

5. An isolating circuit for isolating a first frequency signal in a first frequency range and a second frequency signal in a second frequency range which is non-overlapping with the first frequency range, the isolating circuit comprising:
   an antenna terminal;
   a first filter having a first input terminal for coupling the first frequency signal thereto, and a first output terminal;
   a second filter having a second input terminal for coupling the second frequency signal thereto, and a second output terminal;
   first and second connecting means respectively connecting the first input terminal and the second output terminal to a connecting point, one of the first and second connecting means being a first inductor, the connecting point being connected to the antenna terminal;
   a second inductor connected to the connecting point for connecting the connecting point to ground;
   a capacitor in series with the first inductor between the connecting point and the one of the first input terminal and the second output terminal; and
   a dielectric plate, the first and second inductors and the capacitor respectively comprising first and second strip lines and a capacitance pattern which are formed on the dielectric plate.

6. The circuit according to claim 5, wherein the dielectric plate has a plurality of throughholes, respective ones of the throughholes receiving the first input terminal, the first output terminal, the second input terminal, the second output terminal and the antenna terminal, the circuit further comprising a conductive layer covering the dielectric plate except for portions surrounding the first strip line, the second strip line, the capacitance pattern and the throughholes, the second strip line being connected to the conductive pattern.

7. The circuit according to claim 5, wherein the first inductor and the second inductor have inductance values and the capacitor has a capacitance value which are respectively given so that the circuit has a return loss which is larger than 10 dB at each frequency of the first frequency signal and the second frequency signal.

8. An isolating circuit for isolating a first frequency signal in a first frequency range and a second frequency signal in a second frequency range which is non-overlapping with the first frequency range, the isolating circuit comprising:
   an antenna terminal;
   a first filter having a first coupling terminal for coupling the first frequency signal thereto, and a first output terminal;
   a first capacitor coupling the first coupling terminal to a connecting point;

a second filter having a second coupling terminal for coupling the second frequency signal thereto, and a second output terminal; and a second capacitor coupling the second coupling terminal to the connecting point, the connecting point being electrically connected to the antenna terminal, the first and second capacitors having respective capacitances which increase the return loss of the circuit for signals in the first and second frequency ranges, respectively;

wherein both of the first and second filters are dielectric filters, each of said dielectric filters including a block of dielectric material and an inner conductive layer disposed in the block so as to be surrounded thereby;

the first and second coupling terminals each including an insulating bushing having a recess therein, the first coupling terminal, including the bushing thereof, being disposed in the block of the first filter so as to be surrounded by the block and the inner conductive layer of the first filter, the second coupling terminal, including the bushing thereof, being disposed in the block of the second filter so as to be surrounded by the block and the inner conductive layer of the second filter, each of the first and second coupling terminals having a conductive part having at least first and second edge portions, the first edge portion being inserted into the recess of the respective bushing, each of the first and second capacitors including a solid insulator having a recess therein, and the second edge portion of the conductive part of a respective one of the first and second coupling terminals, the second edge portion the respective conductive part being inserted into the recess of the solid insulator.

9. The circuit according to claim 8, wherein the first and second capacitors have respective capacitances selected so that an imaginary component of input admittances of the circuit at respective central frequencies of the first and second frequency ranges are zero.

10. A duplexer for transmitting a signal to and simultaneously receiving a signal from a common antenna, the duplexer comprising:

a transmitter filter for transmitting a transmitter frequency signal in a trasmitter frequency range, the transmitter filter having a transmitter filter input terminal and a transmitter filter output terminal;

a receiver filter for receiving a receiver frequency signal in a receiver frequency range, the receiver filter having a receiver filter input terminal and a receiver filter output terminal;

a dielectric plate having a specific inductive capacity, the dielectric plate having an outer surface;

an antenna terminal;

a first conductive line coupling the transmitter filter output terminal to a connecting point;

a second conductive line coupling the receiver filter input terminal to the connecting point;

a third conductive line coupling the connecting point to the antenna terminal;

a fourth conductive line; and a conductive layer covering the outer surface of the dielectric plate except a portion thereof, the fourth conductive line being formed on the portion of the surface of the dielectric plate and having a first inductance value, the fourth conductive line connecting the connecting point to the conductive layer.

11. The duplexer according to claim 10, wherein the first conductive line is formed on the portion of the surface of the dielectric plate and has a second inductance value.

12. The duplexer according to claim 11, wherein the third conductive line is formed on the portion of the surface of the dielectric plate and has a third inductance value.

13. The duplexer according to claim 12, wherein the first inductance value, the second inductance value and the third inductance value are respectively given so that the duplexer has a return loss which is larger than 10 dB at each frequency of the first frequency signal and the second frequency signal.

14. The duplexer according to claim 10, wherein the second conductive line has a second inductance value and a capacitance pattern having a capacitance value and is formed on the portion of the surface of the dielectric plate.

15. The duplexer according to claim 14, wherein the inductance values of the second and fourth conductive lines and the capacitance value of the capacitive pattern are respectively given so that the duplexer has a return loss which is larger than 10 dB at each frequency of the first frequency signal and the second frequency signal.

* * * * *